(12) United States Patent
Shimizu et al.

(10) Patent No.: US 7,291,200 B2
(45) Date of Patent: Nov. 6, 2007

(54) MONODISPERSE SPHERICAL METAL PARTICLES AND MANUFACTURING METHOD THEREFOR

(75) Inventors: Masataka Shimizu, Miyazaki (JP); Kiyoshi Torigoe, Miyazaki (JP); Tadao Nakashima, Miyazaki (JP); Izumi Akazaki, Miyazaki (JP)

(73) Assignee: Miyazaki Prefecture, Miyazaki (JP)

( * ) Notice: Subject to any disclaimer, the term of this patent is extended or adjusted under 35 U.S.C. 154(b) by 14 days.

(21) Appl. No.: 11/043,633

(22) Filed: Jan. 26, 2005

(65) Prior Publication Data

US 2005/0126339 A1    Jun. 16, 2005

Related U.S. Application Data

(60) Division of application No. 10/272,472, filed on Oct. 15, 2002, now Pat. No. 6,884,278, which is a continuation-in-part of application No. PCT/JP02/02737, filed on Mar. 22, 2002.

(30) Foreign Application Priority Data

Oct. 26, 2001 (JP) ............................. 2001-328672

(51) Int. Cl.
*B22F 9/08* (2006.01)
(52) U.S. Cl. ....................................... 75/331
(58) Field of Classification Search ................ 75/331, 75/343, 340, 341
See application file for complete search history.

(56) References Cited

U.S. PATENT DOCUMENTS 3,442,988 A * 5/1969 Williams ..................... 75/333
3,504,062 A * 3/1970 Bachowski ................... 75/331
3,720,737 A * 3/1973 Klaphaak et al. ............... 264/8
4,425,286 A * 1/1984 Kennedy ....................... 75/331
4,657,875 A    4/1987 Nakashima et al.
4,863,510 A    9/1989 Tamemasa et al.
5,278,106 A    1/1994 Nakashima et al.
5,588,983 A   12/1996 Tani et al.
5,609,919 A    3/1997 Yuan et al.
6,494,931 B1  12/2002 Mukuno et al.

FOREIGN PATENT DOCUMENTS

| JP | 66-66777 | 2/1986 |
| JP | 61-279603 | 12/1986 |
| JP | 8-2416 | 4/1990 |
| JP | 07-011308 | 1/1995 |
| JP | 11-264004 | 9/1999 |
| JP | 2000-144215 | 5/2000 |
| JP | 2000-192112 | 7/2000 |
| JP | 2000-328112 | 11/2000 |
| JP | 2001-240904 | 9/2001 |

OTHER PUBLICATIONS

R. R. Getty et al., High Performance Thick Film Gold Conductors, Solid State Technology, vol. 26, No. 10, Oct. 1983, pp. 163-168.

* cited by examiner

*Primary Examiner*—Roy King
*Assistant Examiner*—Ngoclan T. Mai

(57) ABSTRACT

It is an object of the present invention to provide spherical metal particles having excellent monodispersity. The present invention relates to a method of manufacturing monodisperse spherical metal particles characterized by passing liquid metal through a porous membrane so as to disperse the resulting liquid metal particles in a continuous liquid phase.

10 Claims, 11 Drawing Sheets

30 μm

50 μm

50 μm

25 μm

MONODISPERSE SPHERICAL METAL PARTICLES AND MANUFACTURING METHOD THEREFOR

CROSS-REFERENCE TO RELATED APPLICATIONS

This application is a divisional of U.S. patent application Ser. No. 10/272,472, filed Oct. 15, 2002 now U.S. Pat. No. 6,884,278, which is a continuation-in-part of International Application No. PCT/JP02/02737, filed on Mar. 22, 2002, and designating, inter alia, the United States, which claims priority to Japanese Patent Application Serial Number 2001-328672, filed Oct. 26, 2001.

BACKGROUND OF THE INVENTION

1. Field of the Invention

The present invention relates to monodisperse spherical metal particles and a manufacturing method therefor.

2. Description of the Related Art

In so-called surface mount technology which is technology for mounting electronic devices with a high density on a printed wiring board or the like, a solder paste obtained by admixing solder particles and a paste-like flux is generally used. The solder paste is printed onto a printed wiring board using a screen printing machine, for example, lead terminals of electronic devices are then brought into contact with the top of the applied solder paste, joining is carried out by reflow (heating), and finally precision wiring is formed on the board.

Spherical particles having a diameter of about 20 to 100 μm are predominantly used as the solder particles in the solder paste. In special cases, particles having a diameter of about 10 μm are used. The solder particles are required to have as uniform a particle diameter as possible and as high a sphericity as possible in order to improve and stabilize the printing characteristics. At the same time, it is necessary for the solder particles to prevent as much as possible surface oxidation of the particles, which has a significant influence on solderability.

In addition to solder particles, another spherical solder material called a solder ball which has a diameter of 100 μm to 1 mm is also used as a terminal material for BGA/CSP type packages, which are becoming the most common type of high-density semiconductor packages. As with solder particles, solder balls are required in terms of product quality to have an extremely narrow particle diameter distribution and a high sphericity.

In recent years, there has been an increasingly accelerated demand for electronic equipment typified by mobile phones, digital video cameras, notebook-sized personal computers and the like to be made smaller, lighter, and of higher performance. This is accompanied by advances in reduction in size of electronic devices. There are thus strong demands for surface mount technology to cope with higher density mounting than hitherto. Taking semiconductor integrated circuit packages as an example, the number of terminal pins increases year by year as the degree of integration of the packages increases, and now it has reached several hundred pins, with the pitch between terminal pins being 0.5 to 0.4 mm. In some cases, a pitch of 0.3 mm has been realized in practical use. This is considered to be the practical limit in surface mount technology at present. Various technical developments and improvements are required to further increase the density of surface mounting.

One of these requirements is to make solder particles smaller, make their particle diameter distribution more uniform, and improve their sphericity. Regarding solder balls, it will be necessary for ultrahigh density, ultra-small packages of the next generation to mount several thousand solder balls per square centimeter. That is, for solder balls, technology for making the particle diameter yet smaller while maintaining an extremely narrow particle diameter distribution and a high sphericity is necessary.

At present, for the manufacture of solder particles, minute particle manufacturing techniques such as (1) a centrifugal atomization method (rotating disc method) and (2) a gas atomization method are used. On the other hand, for the manufacture of solder balls, examples of known methods include (1) a method in which relatively large solder particles obtained through the centrifugal atomization method or the gas atomization method are remelted in alumina powder to make the particles perfectly spherical, (2) a method in which a thin solder wire is accurately cut into small sections and the small sections are then made spherical by remelting in an oil bath, and (3) a method involving dripping drops from a narrow nozzle.

However, the solder particles or solder balls obtained through these methods are polydisperse, and hence a classification process is essential. When trying to manufacture minute spherical solder particles having a high sphericity, the yield is thus extremely low, leading to a loss in productivity. Moreover, even if one tries to obtain minute spherical particles through a classification process while ignoring the low yield, the particles have an increased surface area per unit volume, thereby making surface oxidation of the particles marked. It is thus difficult to manufacture minute spherical solder particles suitable for mounting with an increased density as will be demanded in the future.

Accordingly, it will inevitably become the case that prior art solder particles and balls will no longer be able to cope with surface mounting technology in which the mounting density is becoming increasingly higher, and hence development of new alternative materials is considered to be an urgent task.

SUMMARY OF THE INVENTION

It is thus a principal object of the present invention to provide spherical metal particles having excellent monodispersity.

In view of the above problems of the prior art, the present inventors carried out assiduous studies, and as a result found that metal particles manufactured using a certain specific method enable the above-mentioned object to be achieved, thus eventually accomplishing the present invention.

Thus, the present invention relates to the following monodisperse spherical metal particles and manufacturing method thereof.

1. Monodisperse spherical metal particles, which are metal particles having a cumulative volume distribution satisfying the following conditions as prepared:

1) a particle diameter corresponding to 50 vol % in the distribution is 10 μm or smaller;
   2) a particle diameter corresponding to 10 vol % in the distribution is at least 60% of the particle diameter corresponding to 50 vol % in the distribution; and
   3) a particle diameter corresponding to 90 vol % in the distribution is at most 125% of the particle diameter corresponding to 50 vol % in the distribution.

2. The monodisperse spherical metal particles as set forth in 1 above, wherein a mean aspect ratio (long/short ratio) of the metal particles is 1.1 or less.

3. The monodisperse spherical metal particles as set forth in 1 above, wherein the metal particles is made of a metal having a melting point of 250° C. or less.

4. A method of manufacturing monodisperse spherical metal particles, characterized by passing liquid metal through a porous membrane and dispersing liquid metal particles in a continuous liquid phase.

5. The manufacturing method as set forth in 4 above, wherein the porous membrane is a porous glass membrane.

6. The manufacturing method as set forth in 4 above, wherein the liquid metal is a metal having a melting point of 250° C. or less that has been melted.

7. The manufacturing method as set forth in 4 above, wherein the continuous liquid phase further contains a dispersant.

8. The manufacturing method as set forth in 7 above, wherein the dispersant is a metallic soap.

9. The method as set forth in 4 above, wherein the monodisperse spherical metal particles has a mean particle diameter (particle diameter corresponding to 50 vol % in the cumulative volume distribution) in the range of 0.1-1000 μm.

10. The method as set forth in 5 above, wherein the monodisperse spherical metal particles has a mean particle diameter in the range of 0.1-160 μm.

11. The method as set forth in 4 above, wherein the monodisperse spherical metal particles have a cumulative volume distribution in which
a article diameter corresponding to 10 vol % in the distribution is at least 60% of the particle diameter corresponding to 50 vol % in the distribution; and
a particle diameter corresponding to 90 vol % in the distribution is at most 125% of the particle diameter corresponding to 50 vol % in the distribution.

12. The method as set forth in 11 above wherein a particle diameter corresponding to 50 vol % in the distribution is 10 μm or smaller.

13. An apparatus for manufacturing monodisperse spherical metal particles, comprising a porous membrane which is in contact with liquid metal on one surface and with a continuous liquid phase on the other surface, and a means for pressurizing the liquid metal.

14. The apparatus as set forth in 13 above, wherein the porous membrane is a porous glass membrane.

15. The use of the monodisperse spherical metal particles as set forth in 3 above as solder balls for BGA/CSP type packages.

16. A solder paste comprising the monodisperse spherical metal particles as set forth in 3 above.

The monodisperse spherical metal particles and manufacturing method thereof according to the present invention will be described below in detail.

1. Monodisperse Spherical Metal Particles

The monodisperse spherical metal particles of the present invention are metal particles which have a cumulative volume (size) distribution characterized in that:

1) the particle diameter corresponding to 50 vol % in the distribution (hereinafter referred to as the "50% diameter") is 10 μm or smaller;

2) the particle diameter corresponding to 10 vol % in the distribution (hereinafter referred to as the "10% diameter") is at least 60% of the 50% diameter; and 3) the particle diameter corresponding to 90 vol % in the distribution (hereinafter referred to as the "90% diameter") is at most 125% of the 50% diameter.

The 50% diameter in (1) above is the particle diameter corresponding to a cumulative volume of 50 vol %. In the present invention, the 50% diameter should be 10 μm or smaller and preferably in the range of 0.1 to 10 μm. For example, in FIG. 7, which shows an example of the cumulative volume distribution, the 50% diameter is the particle diameter at the point shown as 23 (about 6.7 μm on the abscissa). The 50% diameter may be determined as appropriate from within the above-mentioned range depending on the application, the purpose of use, and so on.

The 10% diameter in (2) above is the particle diameter corresponding to a cumulative volume of 10 vol %. For example, in FIG. 7, which shows an example of the cumulative volume distribution, the 10% diameter is the particle diameter at the point shown as 22 (about 5.7 μm on the abscissa). In the present invention, the 10% diameter is at least 60% and preferably at least 80% of the 50% diameter.

The 90% diameter in (3) above is the particle diameter corresponding to a cumulative volume of 90 vol %. For example, in FIG. 7, which shows an example of the cumulative volume distribution, the 90% diameter is the particle diameter at the point shown as 24 (about 7.7 μm on the abscissa). In the present invention, the 90% diameter is not greater than 125% and preferably not greater than 110% of the 50% diameter.

The shape of the particles of the present invention may be a sphere or a shape close thereto. Insofar as the effects of the present invention are not impeded, particles having a non-spherical shape (an irregular shape, an ellipsoidal shape, etc.) may be present. In the present invention, the closer the shape is to a perfect sphere, the better. The mean aspect ratio of the particles is thus preferably not more than 1.1 and more preferably not more than 1.05. In the present invention, the mean aspect ratio indicates the value determined by observing spherical metal particles under a scanning electron microscope, an optical microscope, or a metallurgical microscope, measuring the maximum diameter and the minimum diameter for each of 200 particles chosen at random, calculating the aspect ratio (maximum diameter divided by minimum diameter) for each of the chosen particles, and taking the arithmetic mean of the calculated values. In the present invention, the mean aspect ratio is taken as a measure of the sphericity; the closer the value of the mean aspect ratio is to 1, the higher the sphericity.

The material of the monodisperse spherical metal particles of the present invention is not limited, but it is particularly preferable for this material to be a metal having a melting point of 250° C. or below. Note that in the present invention the term "metal" includes alloys, intermetallic compounds, and the like.

Examples of the above-mentioned metal include lead-containing solders such as Sn/Pb, Sn/Bi/Pb, Sn/Ag/Pb, Sn/Sb/Pb, Sn/Ag/Bi/Pb and Sn/Sb/Ag/Pb solders; lead-free solders such as Sn, Sn/Ag, Sn/Cu, Sn/Bi, Sn/In, Sn/Zn, Sn/Sb, Sn/Ag/Cu, Sn/Zn/Bi, Sn/Cu/Sb, Sn/Bi/Ag, Sn/Bi/In, Sn/Cu/Ni, Sn/Zn/In, Sn/Ag/Bi/Cu, Sn/Ag/Cu/In, Sn/Ag/Cu/Sb and Sn/Ag/Cu/Bi/In solders; low-melting metals such as Bi/Pb/Sn, Bi/Sn/Cd, Bi/Pb/Sn/Cd and Bi/Pb/Sn/Cd/In alloys; and mixtures thereof. In addition, various other metals can be used.

The typical compositions (numerals in composition indicating wt %, which is applicable hereinafter) and melting points of these alloys are generally 63 Sn/37 Pb: about 183° C.; 46-60 Sn/3-8 Bi/37-46 Pb: about 172-190° C.; 62-62.8

Sn/0.4-2 Ag/36-36.8 Pb: about 179° C.; 10-27 Sn/3-8 Sb/70-82 Pb: about 188-261° C.; 42-56 Sn/1-3 Ag/2-14 Bi/39-42 Pb: about 137-178° C.; 65 Sn/0.5 Sb/0.4 Ag/34.1 Pb: about 180-186° C.; Sn: about 232° C.; 96.5 Sn/3.5 Ag: about 221° C.; 97 Sn/3 Ag: about 222° C.; 99.25 Sn/0.75 Cu: about 227° C.; 42 Sn/58 Bi: about 139° C.; 48 Sn/52 In: about 118° C.; 91 Sn/9 Zn: about 199° C.; 99 Sn/1 Sb: about 232° C.; 95 Sn/5 Sb: about 232-240° C.; 95.5-99 Sn/0.3-3.5 Ag/0.5-0.75 Cu: about 215-227° C.; 89-89.5 Sn/7.5-8 Zn/3 Bi: about 190-199° C.; 98.8-99 Sn/0.7-0.9 Cu/0.3 Sb: about 227-229° C.; 42-92.5 Sn/7.5-57 Bi/1-2 Ag: about 138-229° C.; 70 Sn/20 Bi/10 In: about 147-169° C.; 99.2 Sn/0.7 Cu/0.1 Ni: about 227-229° C.; 86 Sn/9 Zn/5 In: about 188° C.; 77.5-96 Sn/2-3.2 Ag/1-20 Bi/0.5-0.75 Cu: 138-221° C.; 95.3 Sn/3 Ag/0.7 Cu/1 In: about 214-217° C.; 95.6-96.2 Sn/2.5-3.4 Ag/0.5-0.8 Cu/0.2-0.5 Sb: about 216-221° C.; 92.8 Sn/3 Ag/0.7 Cu/1 Bi/2.5 In: about 204-215° C.; 49 Bi/18 Pb/12 Sn: about 58° C.; 50 Bi/22 Sn/2.8 Cd: about 68° C.; 42.5-50 Bi/26.7-37.7 Pb/11.3-13.3 Sn/8.5-10 Cd: about 70-100° C.; 44.7 Bi/22.6 Pb/8.3 Sn/5.3 Cd/19.1 In: about 46.8° C. The melting points shown can be controlled as appropriate by changing the composition, adding of or alloying with another metal element, and so on. In particular, it is preferable to carry out adjustment such that the melting point is 250° C. or below as mentioned above.

2. Method of Manufacturing Monodisperse Spherical Metal Particles

The method of manufacturing the particles of the present invention is characterized by passing liquid metal through a porous membrane so as to disperse the resulting liquid metal particles in a continuous liquid phase.

There are no limitations on the above-mentioned porous membrane, provided that it allows the liquid metal to pass therethrough. Thus, it can be any porous membrane having at least two through holes.

The shape of the porous membrane is not limited; the shape may be determined as appropriate depending on the manufacturing conditions of the particles of the present invention and other factors. Examples of the shape include a plate shape (flat membrane shape) and a cylindrical shape (pipe shape). Structurally, the membrane may be either symmetrical or asymmetrical, and may be either homogenous or non-homogenous. Furthermore, the membrane may be one in which substrates each having uniform grooves formed in the surfaces thereof are placed on top of one another, or one or more substrates having uniform grooves formed in the surfaces thereof and those having no grooves are placed on top of one another, in such a manner that a porous membrane is finished.

The pore diameter of the porous membrane is not limited, but the mean pore diameter is generally selected as appropriate from the range of 0.05 to 100 µm in accordance with the desired particle diameter and so on. In the present invention, the porous membrane is preferably a microporous membrane having a relative cumulative pore distribution curve in which the value obtained by dividing the pore diameter at which the pore volume accounts for 90% of the total pore volume (90% pore diameter) by the pore diameter at which the pore volume accounts for 10% of the total pore volume (10% pore diameter) (or the ratio of 90% pore diameter to 10% pore diameter) is substantially in the range from 1 to 1.5. Such a membrane itself can be manufactured by a known method. Alternatively, a commercially available membrane can be used.

The cross-sectional shape of the through holes (pores) may be any of circular, elliptical, rectangular (slit-shaped), square, and so on. The through holes may pass through the membrane perpendicular to the membrane surfaces, or obliquely. The through holes may be interconnected with one another.

The material of the porous membrane is not limited, and it includes, for example, glass, ceramics, silicon, resins (especially heat-resistant resins), and metals. A porous membrane having a contact angle in excess of 90° with the liquid metal used is particularly preferable. Even in the case of a porous membrane having a contact angle of 90° or less with the liquid metal, the contact angle can be made to exceed 90° by surface treatment of the porous membrane. For example, it is possible to make the porous membrane hydrophilic or water-repellent by coating with a commercially available surface treating agent, thereby modifying the membrane surface such that the contact angle exceeds 90°.

In the present invention, it is particularly preferable to use a porous glass membrane, which has been used in membrane emulsification for an oil-aqueous phase system as disclosed in Japanese Patent Publication No. 8-2416 and U.S. Pat. No. 5,278,106. A preferred porous glass membrane is made, for example, from porous glass manufactured using micro glass phase separation. Specifically, the porous glass membrane includes the $CaO$—$B_2O_3$—$SiO_2$—$Al_2O_3$ porous glass disclosed in Japanese Patent Publication No. 63-66777, and the $CaO$—$B_2O_3$—$SiO_2$—$Al_2O_3$—$Na_2O$ porous glass and $CaO$—$B_2O_3$—$SiO_2$—$Al_2O_3$—$Na_2O$—$MgO$ porous glass disclosed in U.S. Pat. No. 4,657,875. Regarding these porous glass membranes, again it is preferably a microporous glass membrane having a relative cumulative pore distribution curve in which the ratio of 90% pore diameter to 10% pore diameter is substantially in the range from 1 to 1.5. The mean pore diameter can be selected as appropriate from within the range mentioned above.

There are no limitations on the continuous liquid phase, as long as it is capable of well dispersing liquid metal particles therein, and it can be selected as appropriate depending on the particular liquid metal used and other factors.

For example, water or a water-based liquid phase (such as one selected from various aqueous solutions) can be used. Alternatively, an oil, an organic solvent, or the like can be used.

The oil may be a fat or fatty oil or a mineral oil. The fat or fatty oil includes vegetable oils and fats as well as animal oils and fats. Examples of vegetable oils and fats include soybean oil, rapeseed oil, linseed oil, palm oil, olive oil, coconut oil, and corn oil. Examples of animal oils and fats include beef tallow, lard, whale oil, and sardine oil. As a mineral oil, either a petroleum oil or a synthetic oil can be used. Examples of a petroleum oil include fuel oils such as kerosene, light oil, and heavy oil; lubricating oils such as spindle oil, compressor oil, turbine oil, machine oil, engine oil, and gear oil; paraffin oils such as liquid paraffin and petroleum wax; and other oils such as rust-preventing agents, metal working fluids and insulating oils. Examples of a synthetic oil include silicone oils, olefin polymer oils, diester oils, and polyalkylglycol oils.

The organic solvent may be either hydrophilic or hydrophobic. Thus, a water-soluble organic solvent such as a polyethylene glycol may be used.

In the present invention, it is desirable to select a continuous liquid phase which has a boiling point higher than the melting point of the metal to be used and which is not susceptible to decomposition.

In the present invention, it is preferable that the continuous liquid phase further contain a dispersant. The dispersant is not limited, as long as it can be dissolved or dispersed in the continuous liquid phase and it is capable of suppressing or preventing coalescence of the liquid metal particles even at a temperature in the vicinity of the melting point of the metal which is used.

The dispersant can be selected as appropriate depending on the particular continuous liquid phase used and other factors. Examples of the dispersant include anionic surfactants, cationic surfactants, nonionic surfactants, polymeric surfactants, fluorinated surfactants, and organometallic surfactants.

Additional examples of the dispersant include fluxes, oleophilic surfactants (oil-soluble surfactants), metallic soap, saturated fatty acids, unsaturated fatty acids, and the like. The oleophilic surfactants include those of the sorbitan type, the polyoxyethylene-sorbitan type, the polyoxyethylene-phenyl ether type, the sucrose fatty acid ester type, and the polyglycerol type. The metallic soap includes lead stearate, zinc stearate, calcium stearate, calcium oleate, calcium ricinolate, calcium laurate, calcium behenate, calcium octanoate, zinc laurate, zinc palmitate, zinc myristate, zinc undecylenate, zinc oleate, zinc ricinolate, zinc behenate, zinc salicylate, zinc naphthenate, magnesium stearate, magnesium myristate, magnesium oleate, aluminum stearate, aluminum behenate, aluminum octanoate, lead oleate, lead octanoate, and lead naphthenate, as well as similar cobalt soaps, nickel soaps, iron soaps, copper soaps, manganese soaps, tin soaps, lithium soaps and the like. The saturated fatty acids include butyric acid, caproic acid, caprylic acid, capric acid, lauric acid, myristic acid, palmitic acid, stearic acid, arachidic acid, behenic acid, and the like. The unsaturated fatty acids include oleic acid, linoleic acid, linolenic acid, erucic acid, and the like. It is particularly desirable for these dispersants that they do not decompose at a temperature below 250° C. Those dispersants which become a liquid at the temperature in service can also be used as an oil in that condition.

One or more of these dispersants can be used depending on the particular continuous liquid phase used and other factors. For example, in the case where the continuous liquid phase is (1) a water phase, (2) a water-based phase, or (3) a phase comprising a component or components that dissolve in water, it is preferable to use an anionic surfactant, a cationic surfactant, a nonionic surfactant, a polymeric surfactant, a fluorinated surfactant, an organometallic surfactant, or the like. On the other hand, in the case where the continuous liquid phase is, for example, an oil phase or other than (1) to (3) above (e.g., an oil phase comprising a fat or fatty oil, a mineral oil, or the like), it is preferable to use a flux, an oleophilic surfactant (oil-soluble surfactant), a metallic soap, a saturated fatty acid, an unsaturated fatty acid, or the like.

The amount of the dispersant(s) added may be determined as appropriate depending on the particular dispersant(s), metal, and continuous liquid phase used, and similar factors, but it is generally about 0.1 to 20 wt % and preferably 0.5 to 5 wt %.

When passing the liquid metal through the porous membrane to disperse the resulting liquid metal particles in the continuous liquid phase, there are no limitations on the manner of arrangement of the liquid metal, the continuous liquid phase, and the porous membrane. For example, it is possible to prepare a vessel for the liquid metal and a vessel for the continuous liquid phase, fill these vessels with the liquid metal and the continuous liquid phase, respectively, apply a predetermined pressure to the liquid metal so as to force it into the porous membrane, whereby the liquid metal that has passed through the porous membrane becomes particles and disperse in the form of liquid metal particles in the continuous liquid phase. Subsequently, the resulting liquid metal particles are cooled and the particles of the present invention can be obtained. The manufacturing method according to the present invention will be described below more fully with reference to the drawings.

FIG. 1 is a schematic drawing showing conceptually the state in which monodisperse liquid metal particles are produced according to the present invention. First, a liquid metal 2 and a continuous liquid phase 3 are disposed with a porous membrane 1 having uniform through holes therebetween. In this state, the membrane surface and the pores 4 of the porous membrane are preferentially wetted by the continuous liquid phase. When the pressure applied to the liquid metal exceeds a critical pressure Pc ($Pc = 4 \cdot \gamma \cdot \cos \theta / Dm$ (where $\gamma$ represents the interface tension, $\theta$ represents the contact angle, and $Dm$ represents the mean pore diameter)), the liquid metal penetrates through the pores to form liquid particles, which are dispersed in the continuous liquid phase, thus producing monodisperse liquid metal particles 5. In the case where a dispersant has been added to the continuous liquid phase, the dispersant is present at the interfaces between the liquid metal and the continuous liquid phase, thus serving to increase the stability of the liquid metal particles and suppress coalescence of the particles more effectively. The particle diameter of the liquid metal particles produced is basically determined by the mean pore diameter of the porous membrane. The ratio ($Dp/Dm$) of the particle diameter $Dp$ to the mean pore diameter $Dm$ generally varies depending on the shape of the pores. For example, when a porous glass membrane is used, this ratio can be controlled to be a fixed value within the range of 2.5 to 8, and hence in general the particle diameter of the liquid metal particles can be controlled within the range of 0.1 to 160 µm. When a porous membrane other than a porous glass membrane is used, in general the particle diameter of the liquid metal particles can be controlled to be within the range of 1 to 1000 µm. The particle diameter may be selected as appropriate depending on the usage of the final product and so on. For example, in the case where the monodisperse spherical metal particles of the present invention are used as solder particles for high-density mounting, it is preferable to make the mean particle diameter (50% diameter) 0.1 to 160 µm and especially 0.1 to 100 µm.

FIG. 2 shows an example of an apparatus for implementing the manufacturing method of the present invention. A liquid metal vessel 6 for containing a liquid metal and a membrane module 7 having an integrated porous membrane 1 are immersed in a continuous liquid phase 3 in an upper vessel 8. The continuous liquid phase 3 is heated to a temperature above the melting point of the metal by a heater 9. The continuous liquid phase 3 is also agitated by a circulating pump 10.

The membrane module shown here is of a type in which the liquid metal 2 is forced in from the outside of a pipe-shaped membrane. The material of the vessels may be a corrosion-resistant metal such as stainless steel, a corrosion-resistant resin such as a fluororesin, glass, or the like. The circulating pump causes the continuous liquid phase to flow so that liquid metal particles produced on the membrane surface will not interfere with the production of new liquid metal particles. The application of pressure to the liquid metal may be performed using a gas or hydraulic pressure.

Since the monodisperse liquid metal particles 5 produced have a high density, they move downwards and enter a lower vessel 11 filled with the continuous liquid phase. Here, the temperature in the lower vessel is set using a heater 12 to be lower than the melting point of the metal so that the metal particles solidify in the lower vessel, thus producing a suspension in which solid spherical metal particles 13 are dispersed. The apparatus and technique (for example, the method of causing the continuous phase to flow or circulate, the heating method or means, the vessel shapes, the method of applying pressure, etc.) are not limited to the above-described ones, but a combination of various other methods can be employed.

FIG. 3 shows an example in which the present invention is implemented using a membrane module 15 having a fixed porous membrane 14 of a flat plate shape. A liquid metal in the membrane module is pressurized so as to pass through the porous membrane and disperse in a continuous liquid phase 3 in the form of monodisperse liquid metal particles 5. Here, a magnetic stirrer 16 and a spin bar 17 are used for agitating the continuous liquid phase to produce a flow. The liquid metal particles 5 produced move downwards to pass through a mesh 18 and are accumulated in a lower part of a vessel 19. The mesh can be installed in order to prevent destruction or deformation of the metal particles by the spin bar. With this apparatus, the liquid metal particles are solidified by stopping heating by a heater 9 to allow the system to cool.

The metal particles (solid spherical metal particles) produced by the method of the present invention can be recovered in accordance with a known separation and recovery method. For example, when the solid spherical metal particles are recovered from the above-mentioned suspension, it is possible to replace the continuous liquid phase in the suspension by an organic solvent such as an alcohol, toluene, or acetone, and recover and store the solid spherical metal particles in the organic solvent as is. The continuous liquid phase may be replaced by a paste-like flux. In the case of recovering the solid spherical metal particles as dry particles, the organic solvent may be evaporated in vacuo or in an inert gas (nitrogen gas, argon gas, helium gas, etc.) such that the particles can be recovered without exposure to oxygen.

The manufacturing method of the present invention is generally capable of producing spherical metal particles having a desired particle diameter which is controlled to have a mean particle diameter (50% diameter) in the range of 0.1 to 1000 μm. For example, when the spherical metal particles are to be used as solder particles for high-density mounting, it is possible to produce spherical metal particles having a mean particle diameter of 0.1 to 160 μm and preferably of 0.1 to 100 μm.

In particular, with the manufacturing method of the present invention, it is possible to obtain monodisperse spherical metal particles, which are metal particles having a cumulative volume distribution characterized in that:

1) the particle diameter corresponding to 50 vol % in the distribution is 10 μm or smaller;

2) the particle diameter corresponding to 10 vol % in the distribution is at least 60% of the particle diameter corresponding to 50 vol % in the distribution; and 3) the particle diameter corresponding to 90 vol % in the distribution is at most 125% of the particle diameter corresponding to 50 vol % in the distribution.

The above conditions 2) and 3) are preferably satisfied for monodisperse metal spherical particles having a mean particle diameter larger than 10 μm which are manufactured by the method of the present invention.

According to the present invention, the following excellent effects can be obtained.

(1) Spherical metal particles having excellent monodispersity, which were considered to be difficult to manufacture in the prior art, can be manufactured relatively easily. In particular, the particles of the present invention are advantageous as minute spherical solder particles required for high-density mounting technology or as high-quality solder balls used in BGA/CSP packages and the like. The particles have a high sphericity which results from the high surface tension of the liquid metal particles. The liquid metal particles in the continuous liquid phase have a shape close to that of perfect spheres, and the method of the present invention allows these particles to cool and solidify while preventing them from deforming as far as possible. Thus, the method of the present invention can realize an increased sphericity.

(2) With the method of the present invention, which is implemented in a liquid phase, it is possible to obtain metal particles in which surface oxidation is suppressed compared to the prior art. The manufacturing method of the present invention is capable of producing solid spherical metal particles having a shape close to that of perfect spheres while suppressing surface oxidation, which is a problem with conventional spherical solder particles and solder balls. The reason why surface oxidation can be suppressed is that liquid metal particles are produced in a continuous liquid phase which is isolated from a gaseous phase and can be solidified in that phase. That is, there is absolutely no opportunity for the metal particles to come into contact with oxygen. As a result, solder particles or solder balls for which surface oxidation is suppressed or prevented can be manufactured to advantage by the method of the present invention.

(3) The metal particles of the present invention are also improved in monodispersity, and due to this combined with a spherical shape, they are suitable for use in solder paste or the like. In particular, when a dispersant is used in the continuous liquid phase to produce solid spherical metal particles having hydrophobic groups remaining on the surfaces of the particles, the metal particles have an improved affinity for organic matrices and hence become yet more suitable for use in solder paste. The metal particles are also suitable for use in ink-jet printing or for use as solder particles for fine dispenser application and three-dimensional mounting.

(4) The present invention can greatly contribute to the electronics industry, especially with respect to reduction in size and weight and enhancement in performance of electronic products typified by information and communications equipment.

BRIEF DESCRIPTION OF THE DRAWINGS

FIG. 11 is a picture showing monodisperse solid spherical metal particles obtained in an example.

DETAILED DESCRIPTION OF THE PREFERRED EMBODIMENTS

Figure 1:
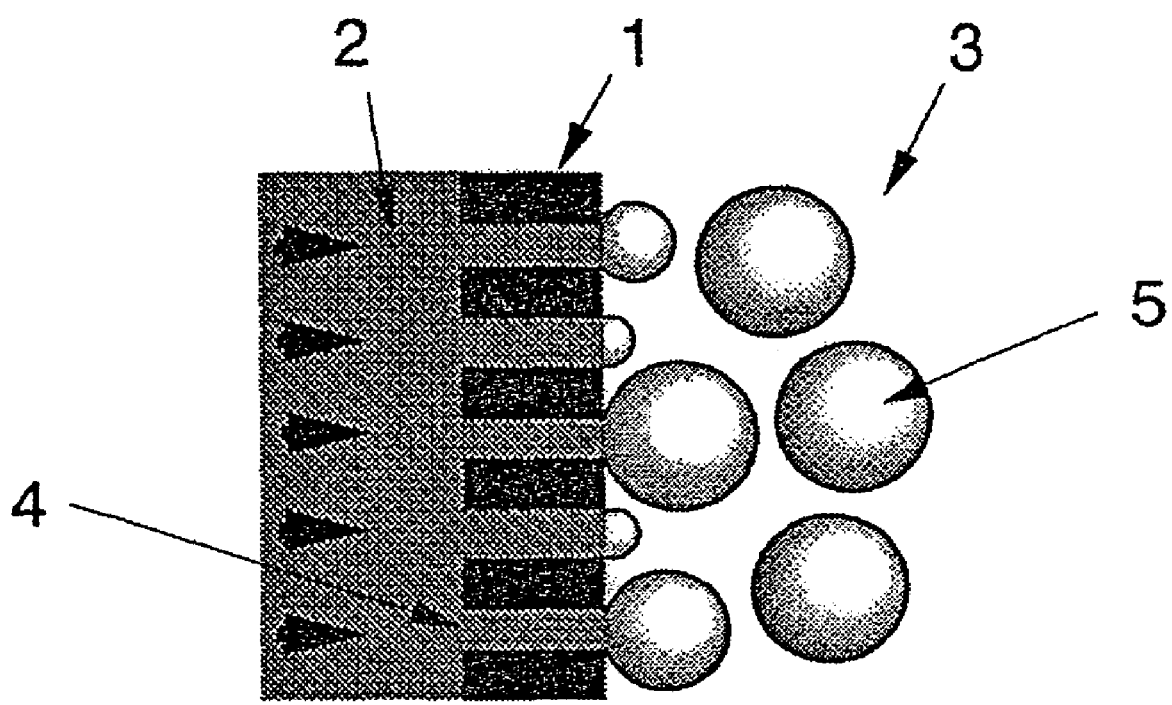
FIG. 1 is a schematic drawing showing a state in which monodisperse liquid metal particles are produced.

The following examples and comparative examples are given to make the characteristic features of the present invention yet clearer. It should be understood that the present invention is not limited to these examples.

The meanings of the numerals in the drawings are as follows: 1, pipe-shaped porous membrane; 2, liquid metal; 3, continuous liquid phase; 4, pores of porous membrane; 5, monodisperse liquid metal particles; 6, liquid metal vessel; 7, membrane module; 8, upper vessel; 9, heater; 10, circulating pump; 11, cooling vessel (lower vessel); 12, heater; 13, monodisperse solid spherical metal particles; 14, plate-shaped porous membrane; 15, membrane module; 16, magnetic stirrer; 17, spin bar; 18, mesh (net); 19, vessel; 20, particle diameter distribution of monodisperse solid spherical metal particles; 21, cumulative volume distribution of monodisperse solid spherical metal particles; 22, 10% diameter in cumulative volume; 23, 50% diameter in cumulative volume; 24, 90% diameter in cumulative volume; 25, particle diameter distribution of monodisperse solid spherical metal particles prepared using a porous glass membrane of mean pore diameter 0.52 µm; 26, particle diameter distribution of monodisperse solid spherical metal particles prepared using a porous glass membrane of mean pore diameter 1.36 µm; 27, particle diameter distribution of monodisperse solid spherical metal particles prepared using a porous glass membrane of mean pore diameter 2.52 µm; 28, particle diameter distribution of monodisperse solid spherical metal particles prepared using a porous glass membrane of mean pore diameter 5.16 µm; 29, particle diameter distribution of monodisperse solid spherical metal particles prepared using a porous glass membrane of mean pore diameter 10.61 µm; 30, particle diameter distribution of monodisperse solid spherical metal particles prepared using a porous glass membrane of mean pore diameter 19.9 µm; 31, solid line showing the relationship between mean particle diameter (Dp) and mean pore diameter (Dm); 32, solid line showing the relationship between mean particle diameter (Dp) and the reciprocal of mean pore diameter (1/Dm).

EXAMPLE 1

The materials used were a commercially available lead-free solder (sold under the tradename "M705" by Senju Metal Industry Co., Ltd., composition: 96.5 Sn/3 Ag/0.5 Cu, melting point: 217-220° C.) as a metal, a hydrophilic porous glass membrane having a mean pore diameter of 2.52 µm (of the $CaO$—$B_2O_3$—$SiO_2$—$Al_2O_3$—$Na_2O$—$MgO$ type, tradename "SPG" manufactured by Miyazaki Prefecture Industrial Technology Center) as a porous membrane, a commercially available lubricating oil as a continuous liquid phase, and zinc stearate (2.0 wt % relative to the oil) as a dispersant. An apparatus as shown in FIG. 2 was used as a manufacturing apparatus.

Figure 2:
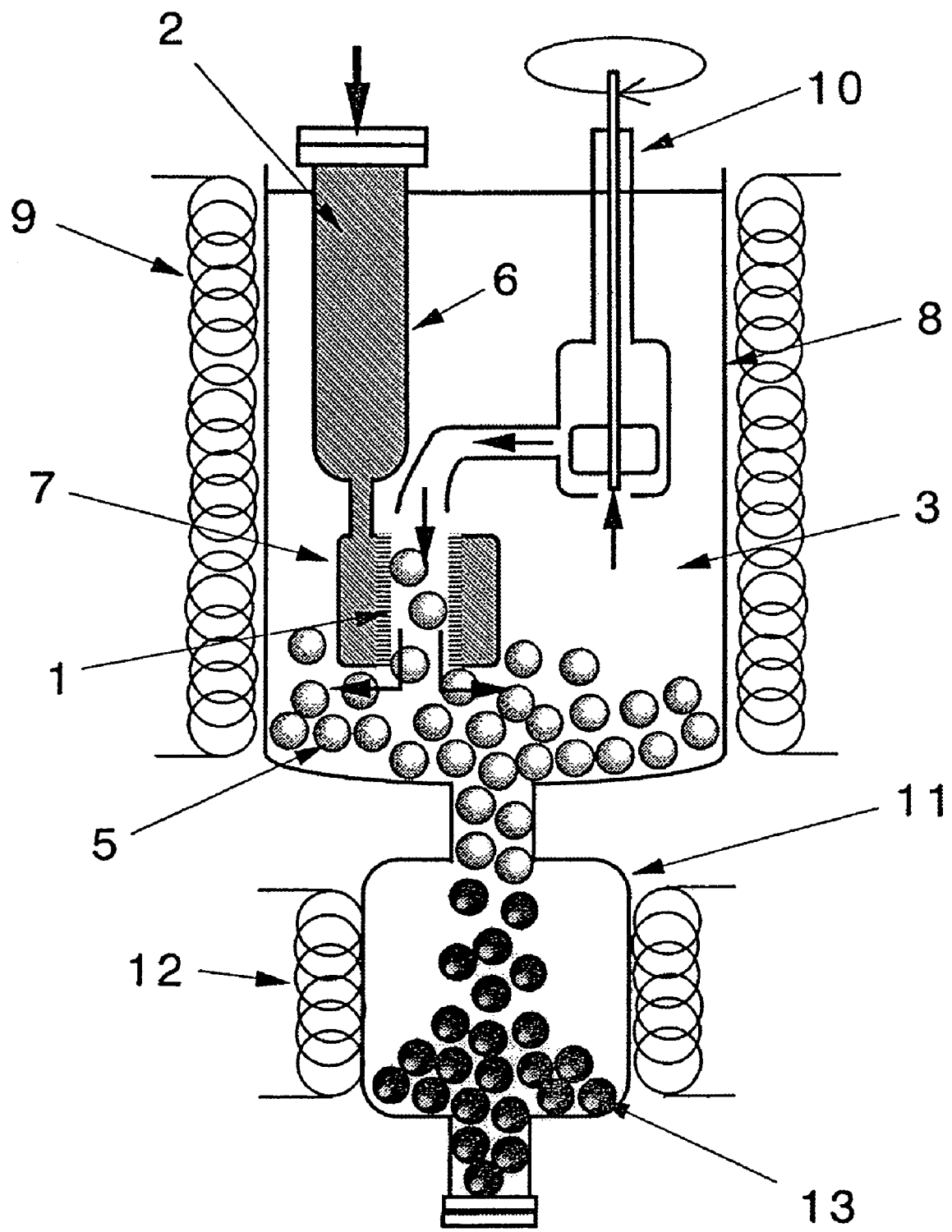
FIG. 2 is a drawing showing an example of an apparatus for implementing the present invention using a pipe-shaped (cylindrical) porous membrane.
Figure 4:
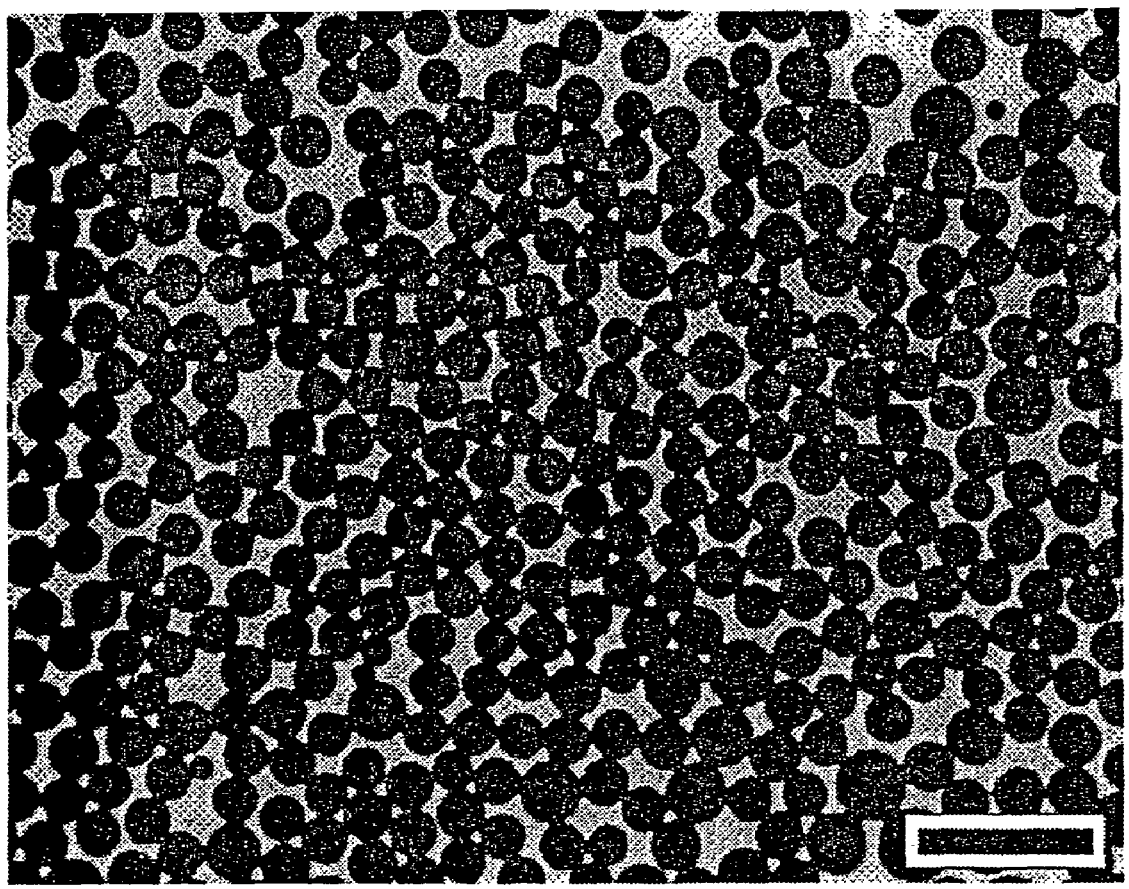
FIG. 4 is a picture showing monodisperse solid spherical metal particles obtained in Example 1.
Figure 5:
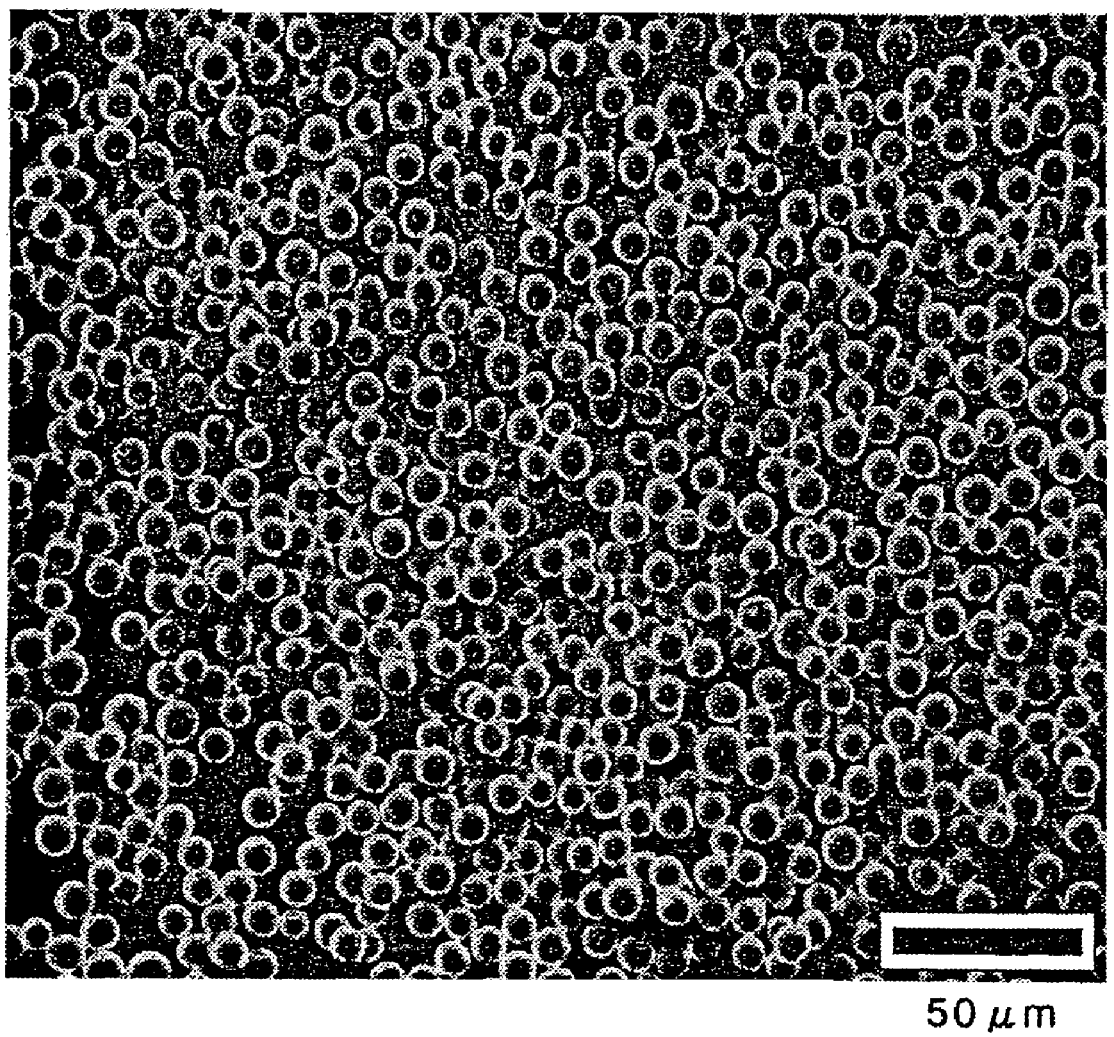
FIG. 5 is another picture showing the monodisperse solid spherical metal particles obtained in Example 1.
Figure 6:
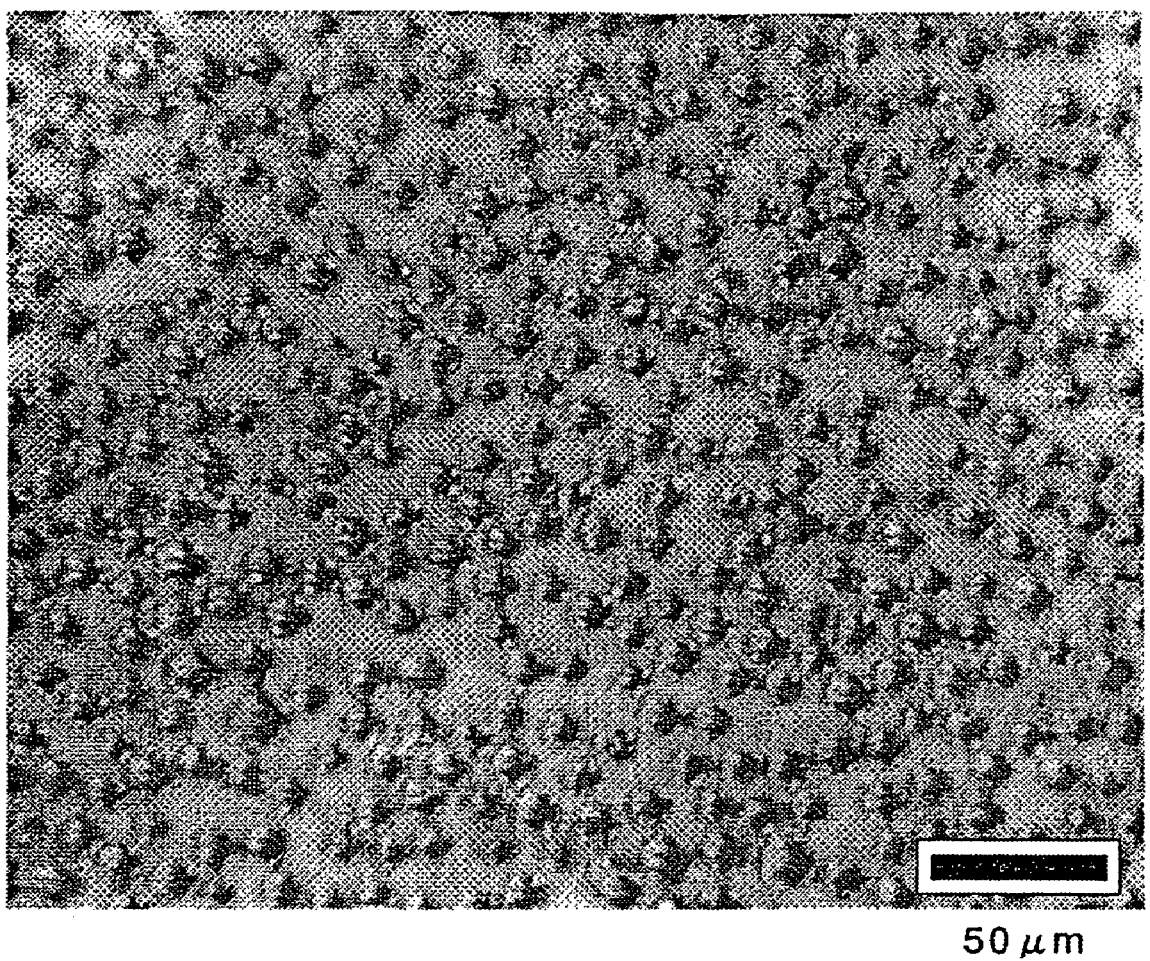
FIG. 6 is still another picture showing the monodisperse solid spherical metal particles obtained in Example 1.
Figure 7:
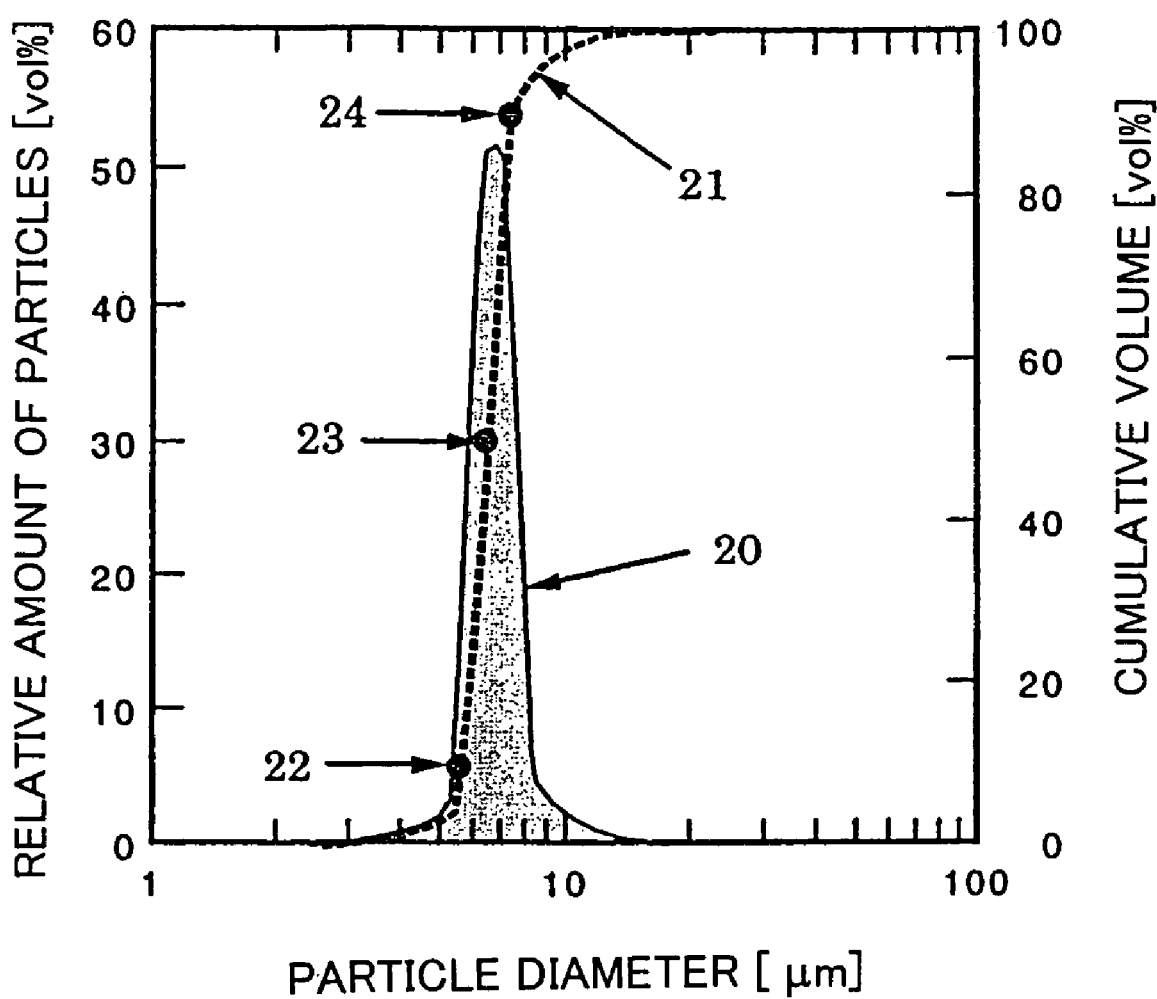
FIG. 7 is a graph showing the particle diameter distribution of the monodisperse solid spherical metal particles obtained in Example 1.

First, the lead-free solder was heated to melt it in a separate vessel, and the molten solder was put into the liquid metal vessel 6 of the apparatus shown in FIG. 2 after removal of an oxidized layer floating on the surface while the temperature in the upper vessel 8 was kept at about 230° C., which is higher than the melting point of the solder. The inside of the lower vessel 11 was kept at a temperature (about 180° C.) which is lower than the melting point of the solder and at which zinc stearate does not precipitate out. Next, the liquid metal 2 was pressurized using a nitrogen gas cylinder as a pressure source, while the continuous liquid phase 3 consisting of the lubricating oil and the dispersant was allowed to circulate using the circulating pump 10. As a result, the liquid metal passed through the membrane at a pressure of 0.56 MPa, thereby forming liquid metal particles of uniform size dispersed in the continuous liquid phase, and a monodisperse emulsion (hereinafter also referred to as the "M/O (metal in oil) emulsion") was obtained. The liquid metal particles sank down into the lower vessel 11 and solidified therein. After the test had been completed, the solid metal particles were recovered along with the continuous liquid phase from the lower vessel 11, and the continuous liquid phase was removed by decantation with toluene. The monodisperse solid spherical metal particles which were obtained were observed under an optical microscope and a scanning electron microscope. The results are shown in FIGS. 4 to 6. FIG. 7 shows the results of measuring the particle diameter distribution of the spherical metal particles. According to the particle diameter distribution of FIG. 7, the distribution is extremely narrow, with the 10% diameter 22 in the cumulative volume distribution 21 being 0.85 times the 50% diameter, and the 90% diameter 24 being 1.15 times the 50% diameter, which indicates that the spherical metal particles are monodisperse. The mean aspect ratio of the particles was 1.03 indicating that the particles had a high sphericity.

EXAMPLE 2

To investigate the control of the particle diameter, which is a characteristic feature of the present invention, the relationship between the mean particle diameter of the solid spherical metal particles and the mean pore diameter of the porous glass membrane which was used was investigated.

Six different hydrophilic porous glass membranes having mean pore diameters of 0.52 µm, 1.36 µm, 2.52 µm, 5.16 µm, 10.61 µm, and 19.9 µm, respectively, were used (all being of the $CaO$—$B_2O_3$—$SiO_2$—$Al_2O_3$—$Na_2O$—$MgO$ type, tradename "SPG" manufactured by Miyazaki Prefecture Industrial Technology Center and having ratios of 90% pore diameter to 10% pore diameter of 1.34, 1.42, 1.28, 1.48, 1.38, and 1.22, respectively). A lead-containing solder having a melting point of 183° C. (sold under the tradename "SN63" by Senju Metal Industry Co., Ltd., composition: 63 Sn/37 Pb) was used as a metal, purified soybean oil was used as an oil, and lead stearate was used as a dispersant (2.0 wt % relative to the oil). Other conditions were the same as in Example 1.

Figure 8:
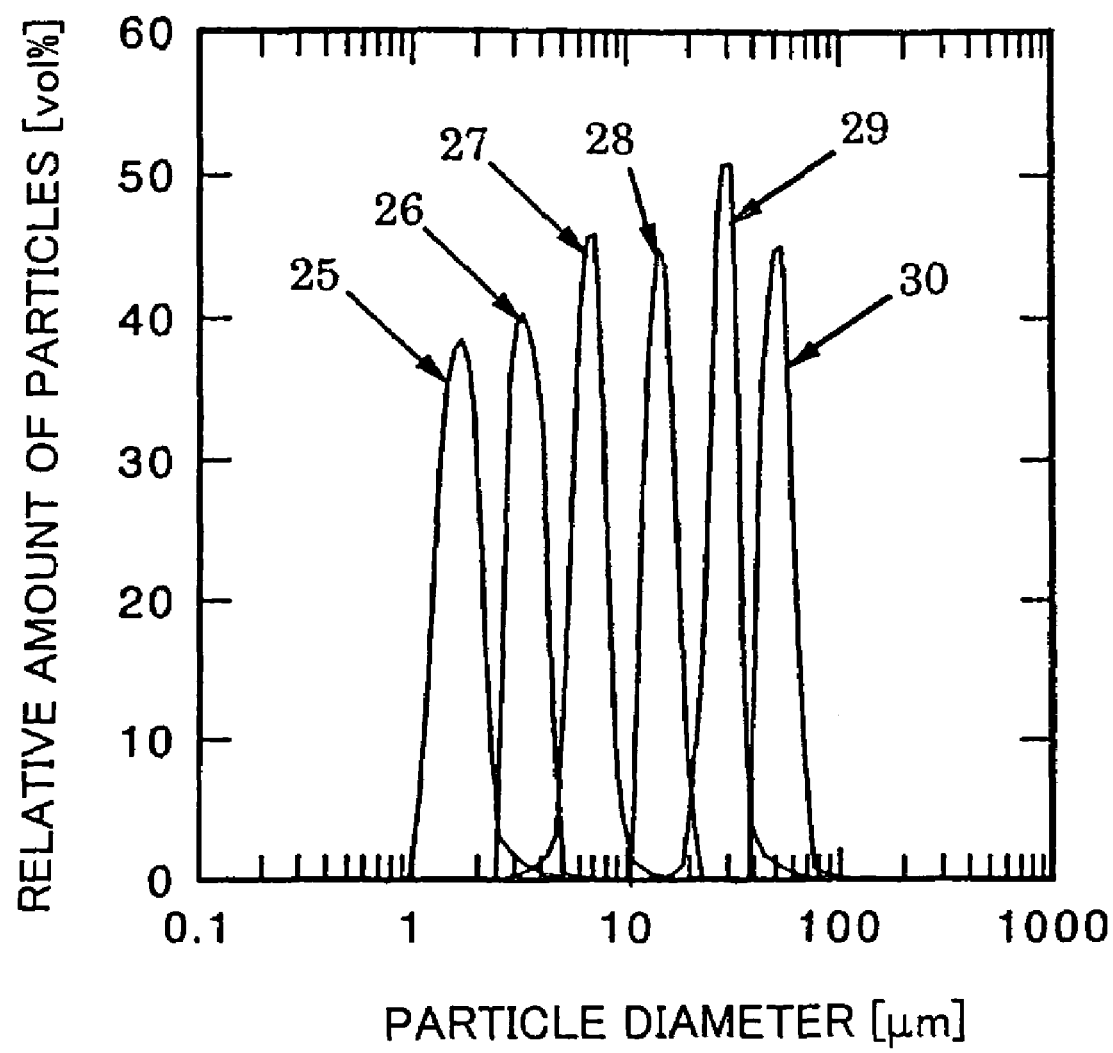
FIG. 8 is a graph showing the particle diameter distributions of six classes of monodisperse solid spherical metal particles having different mean particle diameters.

The particle diameter distribution of the solid spherical metal particles obtained using each of the above-mentioned six porous glass membranes is shown in FIG. 8. A distribution diagram 25 shows the particle diameter distribution for the solid spherical metal particles prepared using the porous glass membrane having a mean pore diameter of 0.52 µm. Similarly, distribution diagrams 26, 27, 28, 29, and show the particle diameter distributions for those particles in which the mean pore diameters were 1.36 µm, 2.52 µm, 5.16 µm, 10.61 µm, and 19.9 µm, respectively.

Figure 9:
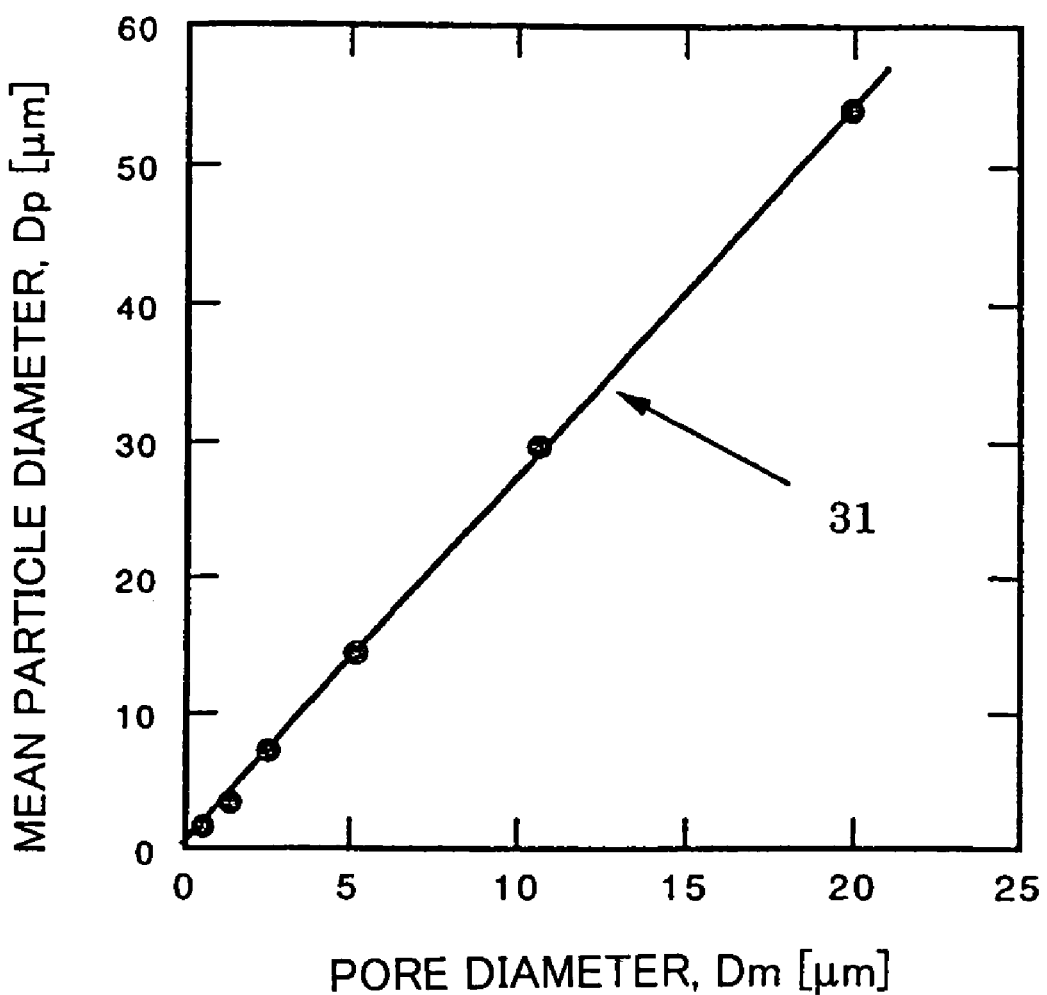
FIG. 9 is a graph showing the relationship between the mean particle diameter Dp and the mean pore diameter Dm.
Figure 10:
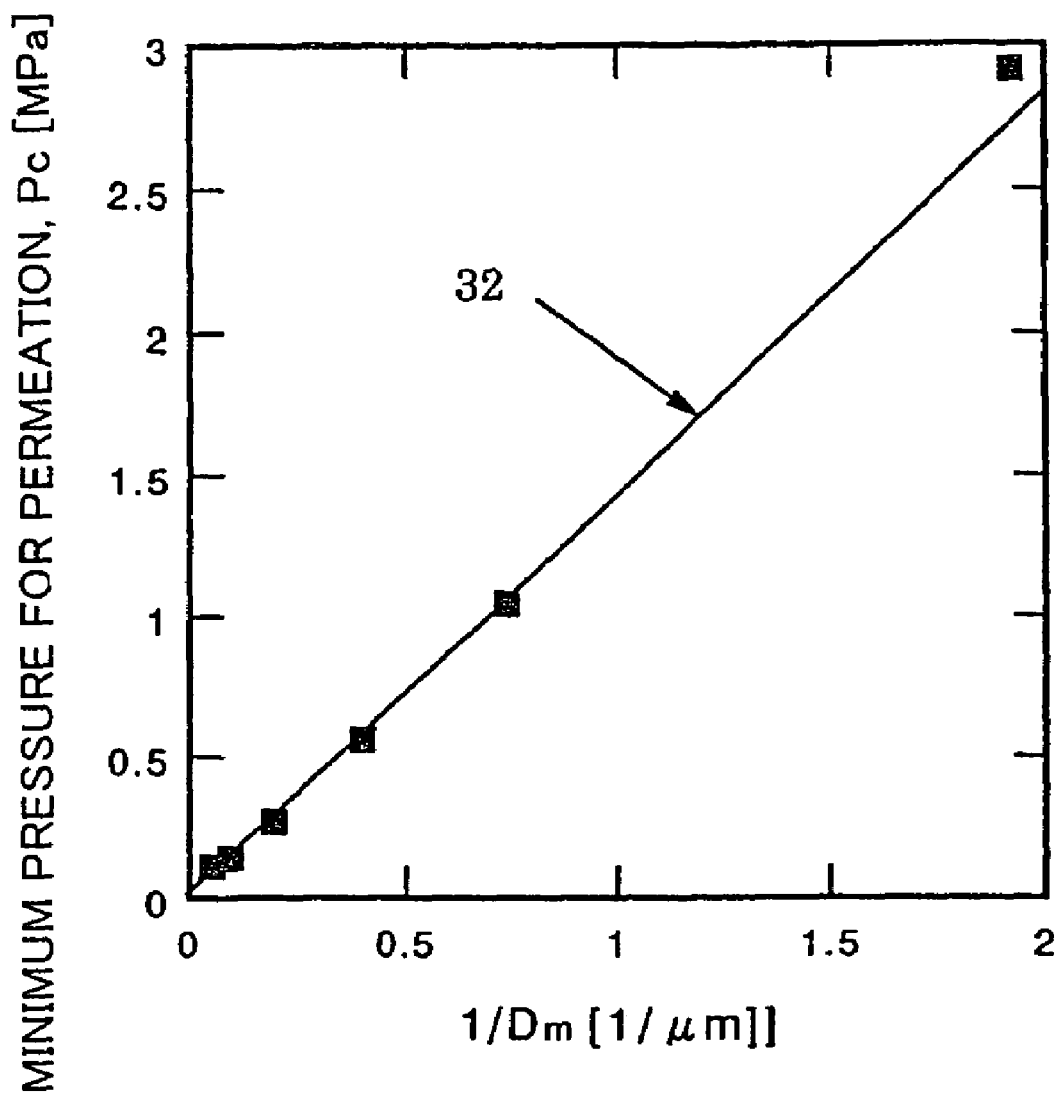
FIG. 10 is a graph showing the relationship between the minimum pressure Pc for a liquid metal to permeate a membrane and the mean pore diameter Dm of the membrane.
Figure 1:
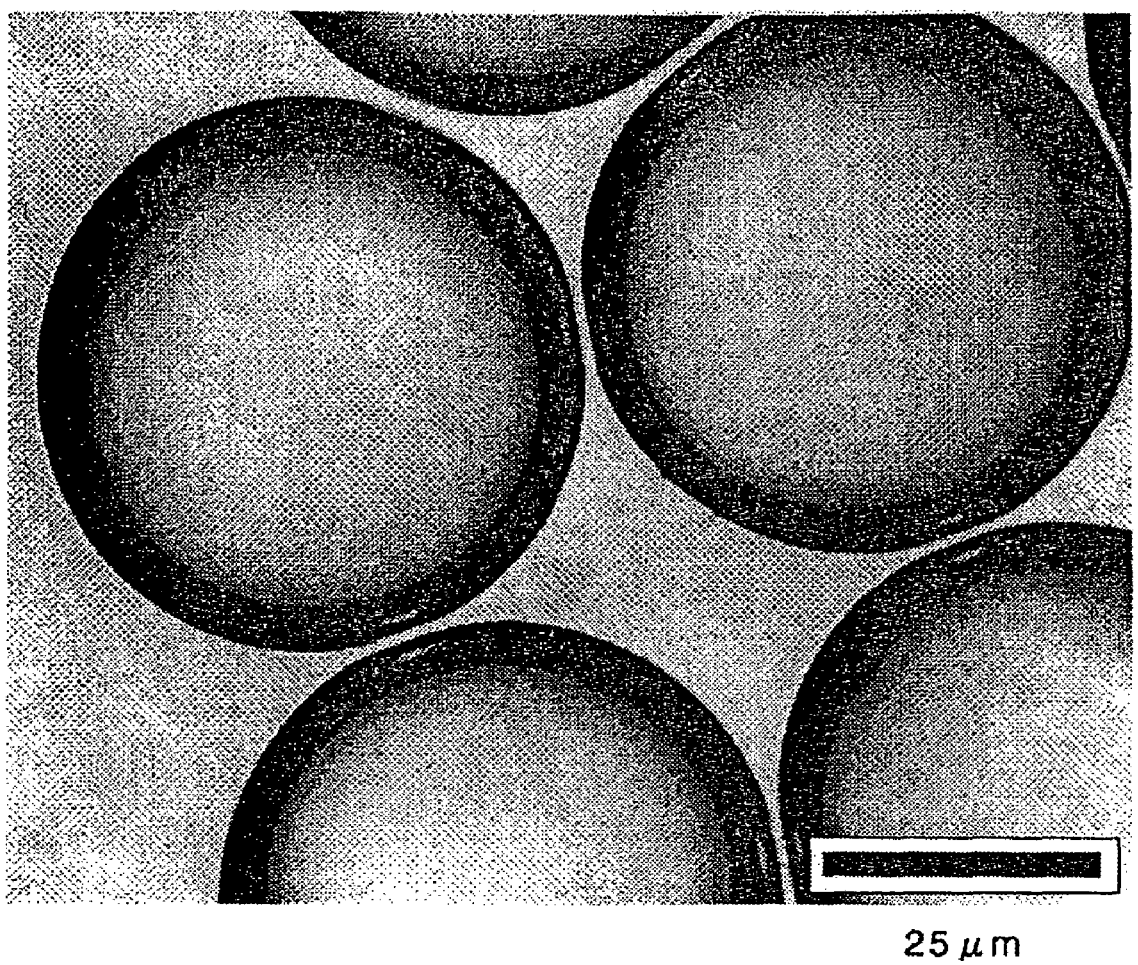

As shown in FIG. 9, the mean particle diameter Dp and the mean pore diameter Dm were proportional to one another, with the ratio Dp/Dm (slope of line 31) being about 2.8. These results indicate that monodisperse solid spherical metal particles of a desired size can be manufactured by varying the mean pore diameter of the porous membrane. FIG. 10 shows the results of measuring the minimum pressure Pc at which the liquid metal started to permeate through the porous membrane for each of the porous membranes. Pc and 1/Dm were proportional to one another, with the slope 4·γ·cos θ (slope of line 32) being 1.41 N/m. Assuming that θ is 180°, then the interfacial tension, γ, between the liquid metal and the continuous phase is calculated as γ=350 mN/m.

EXAMPLE 3

Solid spherical metal particles were prepared using two different systems. The preparation method was the same as in Example 1 except for the following conditions.

The systems which were prepared were system A in which a continuous phase consisted of a silicone oil as an oil and 2 wt % of lead stearate as a dispersant, and system B in which a continuous phase consisted of castor oil as an oil and 2 wt % of zinc stearate as a dispersant. The porous glass membrane used was of the $CaO—B_2O_3—SiO_2—Al_2O_3—Na_2O—MgO$ type having a mean pore diameter of 2.52 µm (tradename "SPG" manufactured by Miyazaki Prefecture Industrial Technology Center). A lead-containing solder of 43 Sn/14 Bi/43 Pb having a melting point of 135-165° C. (solidus temperature: 135° C., liquidus temperature: 165° C.) (sold as "#165" by Senju Metal Industry Co., Ltd.) was used as a metal: The temperature of the upper vessel 8 was kept at about 180° C., and that of the lower vessel 11 at about 130° C.

The results indicated that the solid spherical metal particles prepared using the systems A and B had approximately the same particle diameter distributions as in Example 1. The mean particle diameter was 7.0 µm for system A and 7.1 µm for system B, compared with 7.1 µm for Example 1. The mean aspect ratio was 1.04 for system A and 1.03 for system B, compared with 1.03 for Example 1.

EXAMPLE 4

In order to compare with solder particles contained in commercially available solder pastes with respect to the extent of surface oxidation, two classes of solid spherical metal particles were prepared.

As the commercially available solder pastes, (1) "Universal cream solder" (manufactured by Shinfuji Burner Co., Ltd., 63 Sn/37 Sb, mean particle diameter: 40 µm) (commercial product C), and (2) an industrial-grade solder paste "M31-22BM5" (manufactured by Senju Metal Industry Co., Ltd., 95.75 Sn/3.5 Ag/0.75 Cu, mean particle diameter: 35 µm) (commercial product D) were used. Each of the solder pastes was washed with acetone and toluene to recover solder particles, which were stored in toluene.

The solid spherical metal particles manufactured in Example 2 having a mean particle diameter of 30 µm and the particle diameter distribution diagram 24 (sample E) were used for comparison with the solder particles in commercial product C.

For comparison with the solder particles in commercial product D, solid spherical metal particles (mean particle diameter: 30 µm) (sample F) were used, the particles being obtained in accordance with Example 1 using as a metal a 96.5 Sn/3 Ag/0.5 Cu lead free-solder ("#M705" manufactured by Senju Metal Industry Co., Ltd.) having a composition similar to that of commercial product D. The mean pore diameter of the porous glass membrane which was used was 10.61 µm.

To evaluate the extent of surface oxidation, the heat of oxidation was measured using a differential scanning calorimeter (DSC). The solder particles were placed in a sample cup along with toluene, and the cup was put in a DSC sample chamber. High-purity nitrogen gas was passed through the chamber, which was held at 30° C. After the toluene had evaporated and the calorimetric balance had become stable, air was passed through the chamber, and the heat of oxidation of the sample was measured. The results were that the heat of oxidation generated was 15.9 J/g for commercial product C, 101.3 J/g for sample E, 23.0 J/g for commercial product D, and 94.8 J/g for sample F.

Converting into the heat of oxidation per unit surface area, the values were 1.1 $kJ/m^2$ for commercial product C, 5.1 $kJ/m^2$ for sample E, 1.3 $kJ/m^2$ for commercial product D, and 4.7 $kJ/m^2$ for sample F. These results indicate that surface oxidation is proceeds very little with the solid spherical metal particles manufactured according to the method of the present invention, compared with the commercial products.

EXAMPLE 5

In a conventional membrane emulsification method applied to an oil-water dispersion system, the membrane is preferentially wetted by the continuous liquid phase rather than by the dispersed phase. Therefore, in the case where the continuous liquid phase is an oil phase, the surface of a porous glass membrane must be modified to be hydrophobic. In contrast, in accordance with the present invention, as long as the membrane is made of a material that is not wetted by the liquid metal, it is possible to perform membrane emulsification in order to form a metal-oil emulsion even if the membrane is not subjected to special treatment to make it hydrophobic. To verify this and clarify the effects of a surfactant used as a dispersant, monodisperse solid spherical particles were prepared using the following procedure.

A low-melting metal of 50 Bi/26.7 Pb/13.3 Sn/10 Cd (tradename "U-alloy 70" manufactured by Nilaco Corporation) having a melting point of 70° C. was used as a metal, toluene was used as an oil, and a tetraglycerol-condensed ricinolate ester ("TGCR" manufactured by Sakamoto Yakuhin Kogyo Co., Ltd.) or a sorbitan monooleate ester ("Span 80" manufactured by Wako Pure Chemical Industries, Ltd.) was used at a concentration of 2 wt % as an oleophilic surfactant.

A porous glass membrane having a mean pore diameter 2.52 µm (of the $CaO—B_2O_3—SiO_2—Al_2O_3—Na_2O—MgO$ type, tradename "SPG" manufactured by Miyazaki Prefecture Industrial Technology Center) was made hydrophobic with a silicone resin (sold under the tradename "KP-18C" by Shin-Etsu Chemical Co., Ltd.), and membrane emulsification was carried out using this hydrophobic membrane with the above-mentioned "Span 80" and an apparatus as shown in FIG. 2. The temperature of the upper vessel 8 was set at about 80° C., and that of the lower vessel 11 was set at room temperature.

Separately, the same membrane as above which had not been made hydrophobic (i.e., a hydrophilic membrane) was provided for use to perform membrane emulsification in the same manner as described above using the above-mentioned "TGCR" as an oleophilic surfactant. On the other hand, membrane emulsification was carried out in the same manner as above using the above-mentioned hydrophobic membrane and the above-mentioned "Span 80" as an oleophilic surfactant. Furthermore, membrane emulsification was carried out in the same manner as above using the above-mentioned hydrophilic membrane and the above-mentioned "TGCR" as an oleophilic surfactant.

The results were that in all cases, membrane emulsification started at a pressure of 0.56 to 0.58 MPa and monodisperse solid spherical metal particles having a mean particle diameter of 7.0 to 7.1 µm and a high sphericity were obtained. It was thus verified that with the present invention, membrane emulsification can be carried out even if the membrane surface is not modified.

EXAMPLE 6

Spherical metal particles were produced using a low-melting metal and an aqueous phase as a continuous liquid phase.

A low-melting metal of 44.7 Bi/22.6 Pb/8.3 Sn/5.3 Cd/19.1 In (tradename "U-alloy 47" manufactured by Nilaco Corporation) having a melting point of 46.8° C. was used as a metal in combination with a porous glass membrane having a mean pore diameter of 2.52 µm (of the $CaO-B_2O_3-SiO_2-Al_2O_3-Na_2O-MgO$ type, tradename "SPG" manufactured by Miyazaki Prefecture Industrial Technology Center). Using as a continuous liquid phase (1) an aqueous solution containing 0.5 wt % sodium dodecyl sulfate (SDS) (manufactured by Wako Pure Chemical Industries, Ltd.) as a water-soluble surfactant, (2) an aqueous 2 wt % solution of 60 mole-polyoxyethylene-added hardened castor oil (sold under the tradename "HCO-60" by Nikko Chemicals Co., Ltd.), and (3) an aqueous 2 wt % solution of a 25 mole-polyoxyethylene-added alkyl ether (sold under the tradename "BL-25" by Nikko Chemicals Co., Ltd.), monodisperse solid spherical particles were prepared in each case via an M/W (metal/water) emulsion formed by membrane emulsification. An apparatus as shown in FIG. 2 was used, with the liquid temperature being set at about 60° C. The membrane emulsification was carried out in the same manner as in Example 1 except for the above-described conditions.

The results were that for all of the above-mentioned systems (1) to (3), the membrane emulsification started at a pressure of 0.56 to 0.58 MPa to produce monodisperse solid spherical metal particles having a mean particle diameter of 7.0 to 7.1 µm and a high sphericity.

EXAMPLE 7

Spherical metal particles having a relatively small particle diameter were produced using different liquids for the continuous phase.

A porous glass membrane having a mean pore diameter of 0.30 µm and a 90% pore diameter to 10% pore diameter ratio of 1.22 (tradename "SPG" manufactured by Miyazaki Prefecture Industrial Technology Center) was used in combination with a lead-containing solder having a melting point of 183° C. (sold under the tradename "SN63" by Senju Metal Industry Co., Ltd., composition: 63 Sn/37 Pb) as a metal.

The following two systems were prepared as a continuous liquid phase to perform membrane emulsification.

A first system was prepared using liquid paraffin as a continuous phase liquid and a sucrose erucate ester (sold under the tradename "ER290" by Mitsubishi-Kagaku Foods Corporation) as an oil-soluble dispersant. Since this ester undergoes thermal decomposition at about 183° C. to cause dispersion stability to deteriorate, the membrane emulsification was carried out while the ester was continuously replenished. Other conditions were the same as in Example 1.

In a second system, a polyethylene glycol having a degree of polymerization of 600 was used as a continuous phase liquid, and a decaglycerol stearate ester (sold under the tradename "SWA-10D" by Mitsubishi-Kagaku Foods Corporation) was used as a dispersant. Other conditions were the same as in Example 1.

With both of the continuous liquid phases, monodisperse lead solder spherical particles having a mean particle diameter of 0.85 µm were obtained. It was thus verified that according to the present invention, particles having a mean particle diameter of less than 1 µm can be manufactured and that either an oil-soluble or a water-soluble dispersant can be used.

EXAMPLE 8

Spherical metal particles having a relatively large particle diameter were produced.

Figure 3:
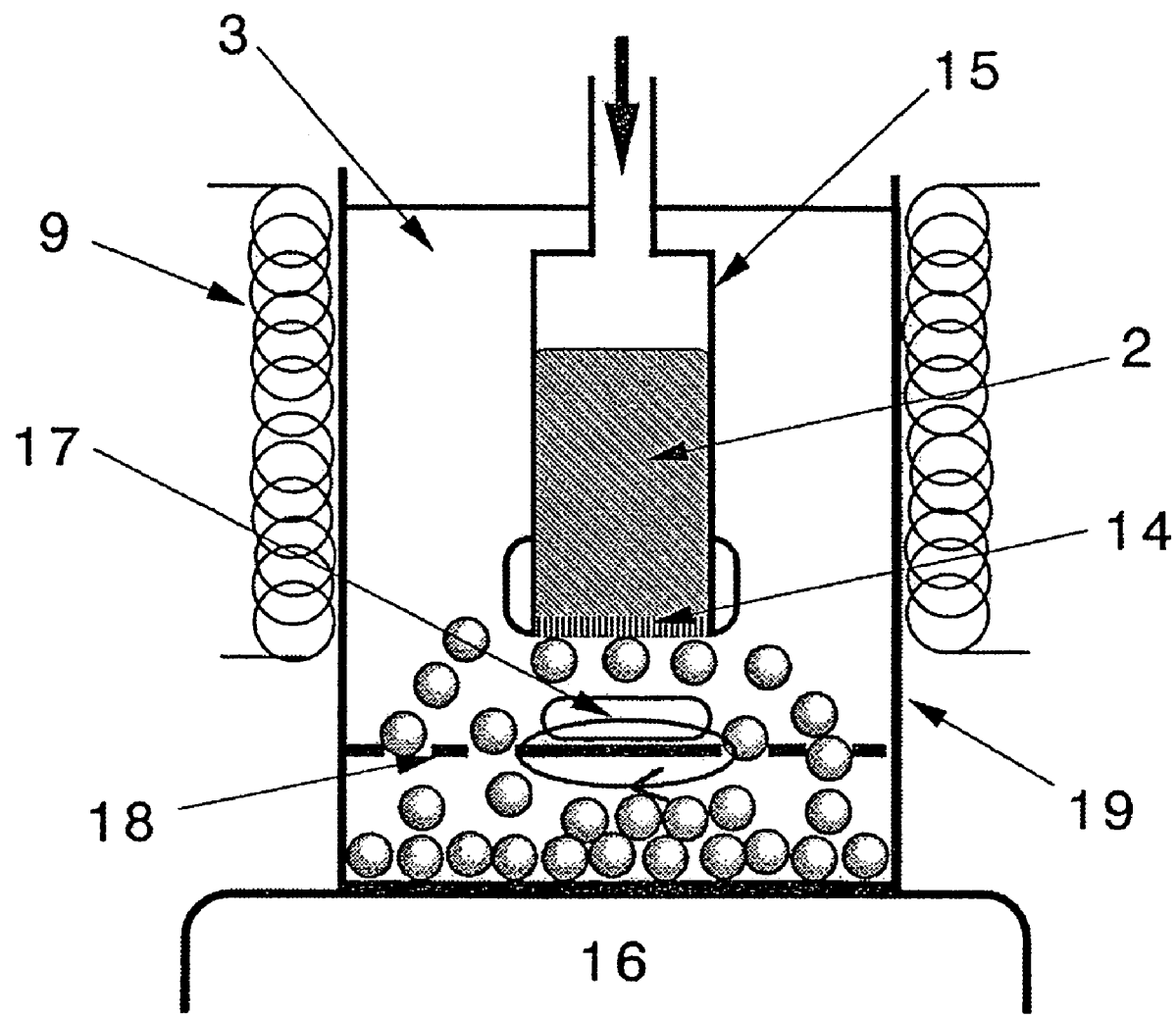
FIG. 3 is a drawing showing an example of an apparatus for implementing the present invention using a flat plate-shaped porous membrane.

The above-mentioned "U-alloy 47" was used as a low-melting metal, and a commercially available kerosene was used to form a continuous liquid phase along with an oleophilic surfactant "TGCR" as a dispersant. The manufacturing apparatus used for membrane emulsification was an apparatus as shown in FIG. 3 in which the system was heated at about 60° C.

Four types of porous membrane were used: a porous glass membrane of flat membrane type having a mean pore diameter of 18.8 µm (membrane G), a flat porous glass membrane prepared by subjecting membrane G to alkali etching to make the mean pore diameter larger (membrane H), an epoxy resin flat membrane having a mean pore diameter of 100 µm in which pores passed through the membrane perpendicular to the membrane surfaces (membrane I), and a stainless steel flat membrane having slit-shaped through holes measuring 50 µm in width and 10 µm in length (membrane J). Membrane J was coated with a fluorinated silane compound (sold under the tradename "KBM7803" by Shin-Etsu Chemical Co., Ltd.). The ratios of 90% pore volume to 10% pore volume of these membranes were 1.40 for membrane G and 1.62 for membrane H and were estimated at about 1.0 for both of membranes I and J.

The results were that monodisperse solid spherical metal particles of high sphericity were obtained in each case, with the mean particle diameter being 53 µm for membrane G, 140 µm for membrane H, 300 µm for membrane I, and 35 µm for membrane J. The results of observing the monodisperse solid spherical particles obtained with membrane G under an optical microscope are shown in FIG. 11. These results show that the manufacturing method of the present invention is capable of not only controlling the particle diameter to be within the range of 1 to 100 µm but also producing larger monodisperse solid spherical particles.

The invention claimed is:

1. A method of manufacturing monodisperse spherical metal particles, comprising passing liquid metal through a porous membrane and dispersing the resulting liquid metal particles directly in a continuous liquid phase.

2. The method according to claim 1, wherein the porous membrane is a porous glass membrane.

3. The method of claim 2, wherein the monodisperse spherical metal particles have a mean particle diameter in the range of 0.1-160 μm.

4. The method according to claim 1, wherein the liquid metal is a metal having a melting point of at most 250° C. which has been melted.

5. The method according to claim 1, wherein the continuous liquid phase further contains a dispersant.

6. The method according to claim 5, wherein the dispersant is a metallic soap.

7. The method of claim 1, wherein the monodisperse spherical metal particles have a mean particle diameter (particle diameter corresponding to 50 vol % in the cumulative volume distribution) in the range of 0.1-1000 μm.

8. The method of claim 1, wherein the monodisperse spherical metal particles have a cumulative volume distribution in which:
 (a) a particle diameter corresponding to 10 vol % in the distribution is at least 60% of the particle diameter corresponding to 50 vol % in the distribution; and
 (b) a particle diameter corresponding to 90 vol % in the distribution is at most 125% of the particle diameter corresponding to 50 vol % in the distribution.

9. The method of claim 8, wherein a particle diameter corresponding to 50 vol % in the distribution is 10 μm or smaller.

10. The method of manufacturing monodisperse spherical metal particles as claimed in claim 1 as solder balls for BGA/CSP type packages.

* * * * *